United States Patent
Liu et al.

(10) Patent No.: US 7,525,363 B2
(45) Date of Patent: Apr. 28, 2009

(54) DELAY LINE AND DELAY LOCK LOOP

(75) Inventors: Zhongding Liu, Taipei (TW); Jingran Qu, Taipei (TW)

(73) Assignee: Via Technologies, Inc., Taipei (TW)

( * ) Notice: Subject to any disclaimer, the term of this patent is extended or adjusted under 35 U.S.C. 154(b) by 126 days.

(21) Appl. No.: 11/834,075

(22) Filed: Aug. 6, 2007

(65) Prior Publication Data
US 2008/0054958 A1    Mar. 6, 2008

Related U.S. Application Data

(60) Provisional application No. 60/824,291, filed on Sep. 1, 2006.

(30) Foreign Application Priority Data

Mar. 1, 2007    (TW) .............................. 96106951 A

(51) Int. Cl.
*H03H 11/26* (2006.01)
(52) U.S. Cl. .................. 327/269; 327/270; 327/276; 327/158; 327/161
(58) Field of Classification Search .............. 327/269, 327/270, 271, 273, 276, 277, 158, 161
See application file for complete search history.

(56) References Cited

U.S. PATENT DOCUMENTS

| | | | | |
|---|---|---|---|---|
| 5,128,554 A | * | 7/1992 | Hoshizaki | 327/147 |
| 5,801,559 A | * | 9/1998 | Sawai et al. | 327/116 |
| 6,140,854 A | * | 10/2000 | Coddington et al. | 327/158 |
| 6,229,364 B1 | * | 5/2001 | Dortu | 327/158 |
| 6,441,657 B1 | * | 8/2002 | Saeki | 327/119 |
| 6,771,103 B2 | * | 8/2004 | Watanabe et al. | 327/161 |
| 7,319,351 B2 | * | 1/2008 | Zhang et al. | 327/158 |
| 7,403,056 B2 | * | 7/2008 | Qu et al. | 327/269 |
| 2001/0009385 A1 | * | 7/2001 | Lai et al. | 327/158 |
| 2005/0212574 A1 | * | 9/2005 | Tokuhiro | 327/158 |
| 2006/0214709 A1 | * | 9/2006 | Nygren et al. | 327/158 |

* cited by examiner

*Primary Examiner*—Tuan T Lam
(74) *Attorney, Agent, or Firm*—Thomas, Kayden, Horstemeyer & Risley

(57) ABSTRACT

A delay line comprises first and second delay arrays and a multiplexer. The first delay array receives a clock signal and a delay control signal, and delays the clock signal to output a first delay array clock signal according to the delay control signal. The second delay array receives a power control signal, the first delay array clock signal and the delay control signal. The second delay array is turned on or off according to the power control signal. If the second delay array is turned on, the second delay array delays the first delay array clock signal to output a second delay array clock signal according to the delay control signal. The multiplexer receives a selecting control signal, the first and second delay array clock signals, and outputs the first delay array clock signal or the second delay array clock according to the selecting control signal.

16 Claims, 4 Drawing Sheets

DELAY LINE AND DELAY LOCK LOOP

CROSS REFERENCE TO RELATED APPLICATIONS

This application claims the benefit of U.S. Provisional Application No. 60/824,291, filed Sep. 1, 2006.

BACKGROUND OF THE INVENTION

1. Field of the Invention

The invention relates to a delay lock loop (DLL), and in particular relates to a low power consumption delay lock loop.

2. Description of the Related Art

Recently, the speeds of very large scale integrated circuits (VLSI) have gotten faster and faster. Thus, increasing reference clock signals in integrated circuits. Correspondingly, high speed integrated circuit designers are focusing on how to reduce clock skews and clock jitters. Since delay lock loops are easy to design and are stable, delay lock loops are commonly used for clock calibration. Delay lock loops and phase locked loops are commonly used in high speed digital circuits, such as microprocessors, memory interfaces and communication ICs. However, because chips are becoming more integrated and faster, power consumption has increased. Correspondingly, the question of "How to reduce power consumption of circuits in an integrated circuit?" have also become more and more important for circuit designers.

BRIEF SUMMARY OF THE INVENTION

A detailed description is given in the following embodiments with reference to the accompanying drawings.

An embodiment of a delay line is provided. A delay line comprises a decoder, a first delay array, a second delay array and a multiplexer. The decoder receives a control signal to generate a delay control signal, a power control signal and a selecting control signal. The first delay array receives a clock signal and the delay control signal and delays the clock signal according to the delay control signal to output a first delay array clock signal. The second delay array receives the power control signal, the first delay array clock signal and the delay control signal and turns on or off the second delay array according to the power control signal. When the second delay array is turned on, the second delay array delays the first delay array clock signal according to the delay control signal to output a second delay array clock signal. The multiplexer receives the selecting control signal, the first delay array clock signal and the second delay array clock signal and selects the first delay array clock signal or the second delay array clock signal according to the selecting control signal to output a first delay signal.

Another embodiment of a delay lock loop is provided. The delay lock loop comprises a first delay line, a second delay line, an inverter, a phase detector, a counting controller and a divider. The first delay line delays a clock signal to generate a first delay signal according to a control signal. The second delay line delays the first delay signal to generate a second delay signal according to the control signal. The inverter inverts the clock signal by 180 degrees to generate an inverting signal. The phase detector compares the second delay signal and the inverting signal to generate a phase control signal. The counting controller receives the phase control signal to generate the control signals for the second delay signal and the inverting signal to be in phase. The divider divides the clock signal to generate a reference clock signal for the counting controller. In addition, the first delay line comprises a decoder, a first delay array, a second delay array and a multiplexer. The decoder receives the control signal to generate a delay control signal, a power control signal and a selecting control signal. The first delay array receives the clock signal and the delay control signal and delays the clock signal according to the delay control signal to output a first delay array clock signal. The second delay array receives the power control signal, the first delay array clock signal and the delay control signal and turns on or off the second delay array according to the power control signal. When the second delay array is turned on, the second delay array delays the first delay array clock signal according to the delay control signal to output a second delay array clock signal. The multiplexer receives the selecting control signal, the first delay array clock signal and the second delay array clock signal and selects the first delay array clock signal or the second delay array clock signal according to the selecting control signal to output the first delay signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
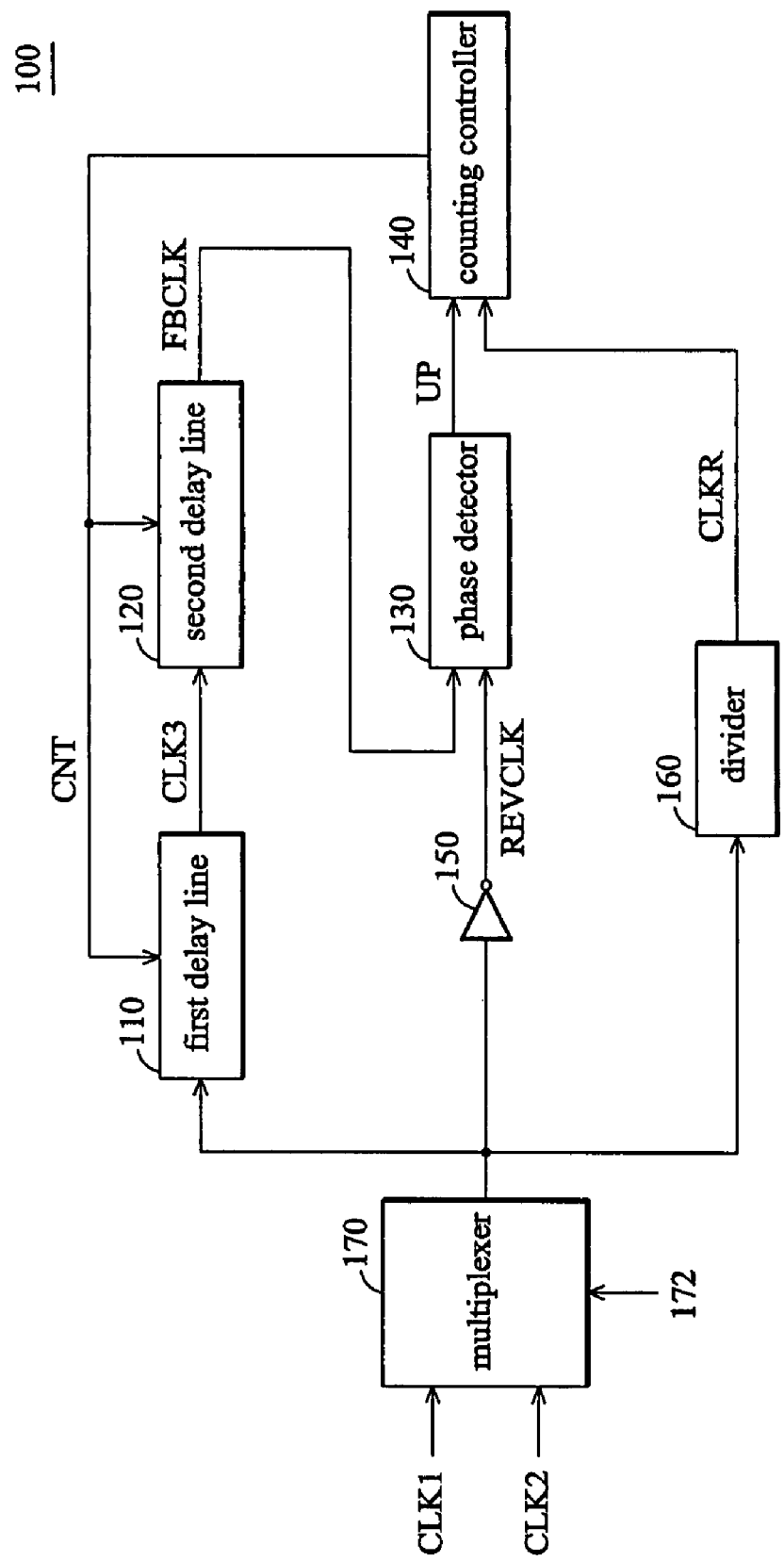
FIG. 1 is a schematic diagram of a delay lock loop according to an embodiment of the invention.

FIG. 1 is a schematic diagram of delay lock loop 100 according to an embodiment of the invention. Delay lock loop 100 comprises first delay line 110, second delay line 120, phase detector 130, counting controller 140, inverter 150, divider 160 and multiplexer (MUX) 170. Multiplexer 170 receives two clock signals CLK1 and CLK2 and outputs one of the clock signals CLK1 and CLK2 to inverter 150, divider 150 and first delay line 110 according to control signal 172. The following description assumes multiplexer 170 outputs clock signal CLK1 as an example. Inverter 150 inverts clock signal CLK1 by 180 degrees to output inverting signal REVCLK to phase detector 130. First delay line 110 delays clock signal CLK1 by a delay time to output delay signal CLK3 to second delay line 120 according to control signal CNT. Similarly, second delay line 120 delays delay signal CLK3 by a delay time to output delay signal FBCLK to phase detector 130 according to control signal CNT. Thus, there is a 180 degree phase difference between delay signal FBCLK and clock signal CLK1. Phase detector 130 compares phase differences between delay signal FBCLK and inverting signal REVCLK. Meanwhile, divider 160 divides clock signal CLK1 by a number, for example: 4, to generate reference clock signal CLKR to counting controller 140 for a reference clock.

When the phase of delay signal FBCLK is ahead of the phase of the inverting signal REVCLK, specifically, the delay clock FBCLK is faster than the inverting signal REVCLK, phase detector 130 outputs control signal UP=1 and counting controller 140 increases counting number (n=n+1). Thus, when the counting number increases, first delay line 110 and second delay line 120 increase delay time to delay clock signal CLK1 such that the phases of delay signal FBCLK and inverting signal REVCLK become the same. When the phase of delay signal FBCLK is behind the phase of inverting signal REVCLK, specifically, the delay signal FBCLK is slower than the inverting signal REVCLK, phase detector 130 outputs control signal UP=0 and counting controller 140 decreases counting number (n=n-1). Thus, when the counting number decreases, first delay line 110 and second delay line 120 decrease delay time to delay clock signal CLK1 such that the phases of delay signal FBCLK and inverting signal REVCLK become the same. Finally, delay lock loop 100 reaches a stable state in that delay signal FBCLK and inverting signal REVCLK are in phase. First delay line 110 and second delay line 120 generates 90 degree phase differences.

Figure 2:
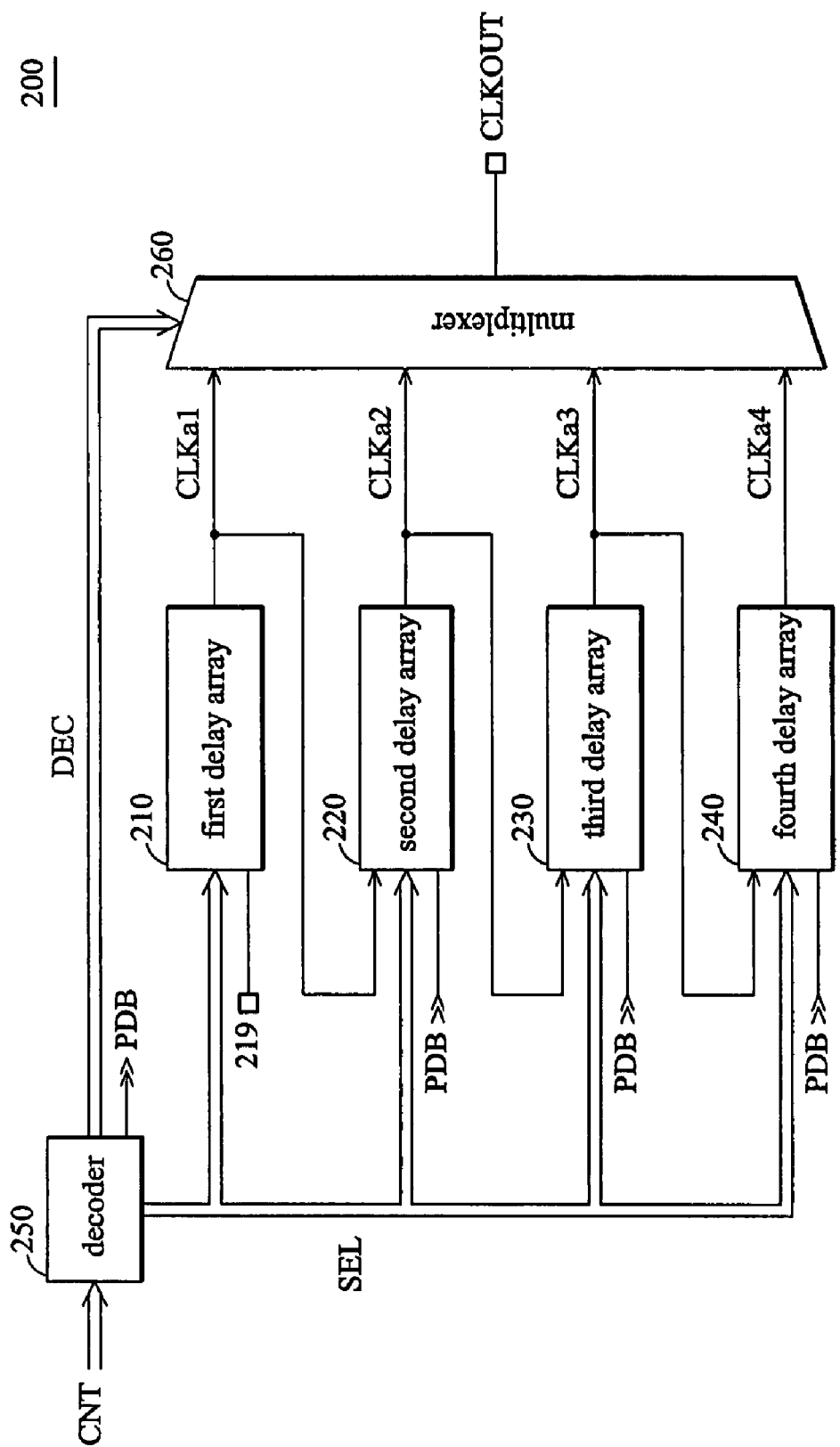
FIG. 2 is a schematic diagram of a delay line according to another embodiment of the invention.

FIG. 2 is a schematic diagram of delay line 200 according to another embodiment of the invention. Delay line 200 comprises decoder 250, first delay array 210, second delay array 220, third delay array 230, fourth delay array 240 and multiplexer 260. Delay line 200 can be first delay line 110 or second delay line 120 of FIG. 1. In addition, delay line 200 is not limited to comprising only four delay arrays. Delay line 200 may comprise any number of delay arrays.

Referring to FIGS. 1 and 2, assuming delay line 200 as first delay line 110 and multiplexer 170 outputting clock CLK1 as an example, first delay line 110 delays clock signal CLK1 by a delay time according to control signal CNT. Power control signal PDB can decide whether or not second delay array 220, third delay array 230 and fourth delay array 240, respectively are turned on or off for power saving.

Decoder 250 receives controls signal CNT to generate delay control signal SEL, power control signal PDB and selecting output control signal DEC. First delay array 210 receives clock signal CLK1 from clock receiving terminal 219 and receives delay control signal SEL. First delay array 210 delays clock signal CLK1 to output first delay array clock signal CLKa1 to multiplexer 260 and second delay array 220 according to delay control signal SEL. Second delay array 220 receives power control signal PDB, first delay array clock signal CLKa1 and delay control signal SEL. Second delay array 220 is turned on or off according to power control signal PDB. When second delay array 220 is turned on, second delay array 220 delays first delay array clock signal CLKa1 to output second delay array clock signal CLKa2 to multiplexer 260 and third delay array 230 according to delay control signal SEL. Third delay array 230 receives power control signal PDB, second delay array clock signal CLKa2 and delay control signal SEL. Third delay array 230 is turned on or off according to power control signal PDB. When third delay array 230 is turned on, third delay array 230 delays second delay array clock signal CLKa2 to output third delay array clock signal CLKa2 to multiplexer 260 and fourth delay array 240 according to delay control signal SEL. Fourth delay array 240 receives power control signal PDB, third delay array clock signal CLKa3 and delay control signal SEL. Fourth delay array 240 is turned on or off according to power control signal PDB. When fourth delay array 240 is turned on, fourth delay array 240 delays third delay array clock CLKa3 to output fourth array clock signal CLKa3 to multiplexer 260 according to delay control signal SEL.

Multiplexer 260 selects one of the delay array clock signals; first delay array clock signal CLKa1, second delay array clock signal CLKa2, third delay array clock signal CLKa3 or fourth delay array clock signal CLKa3, to output to clock output terminal CLKOUT according to selecting output control signal DEC. Since second delay line 120 is the same as first delay line 110, the process is not repeated again.

Figure 3:
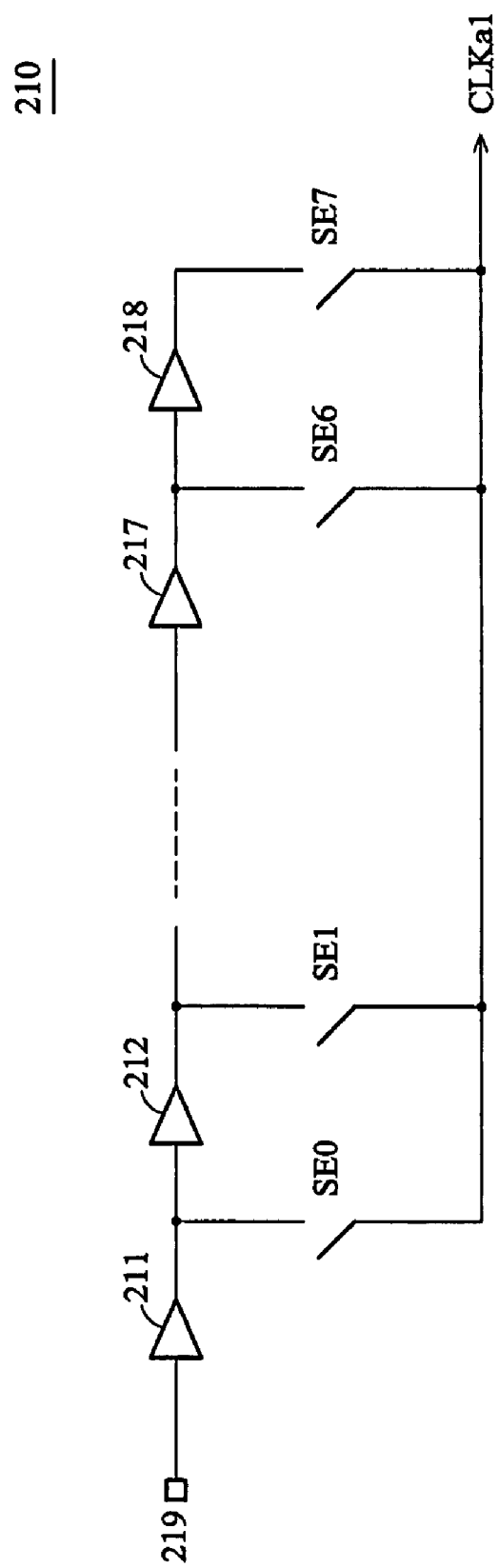
FIG. 3 is a schematic diagram of a delay array according to another embodiment of the invention.

FIG. 3 is a schematic diagram of delay array 210 according to another embodiment of the invention. Delay array 210 comprises eight delay devices 211~218 and eight switches SE0~SE7. As shown in FIG. 3, delay array 210 receives clock signal CLK1 or CLK2 from clock receiving terminal 219. One of eight switches SE0~SE7 is turned on according to delay control signal SEL to control the delay time of clock signals CLK1 or CLK2 to output first delay array clock signal CLKa1. Delay devices 211~218 have same delay times. In addition, delay array 210 is not limited to comprising only eight delay devices. Delay array 210 may comprise any number of delay devices.

Figure 4:
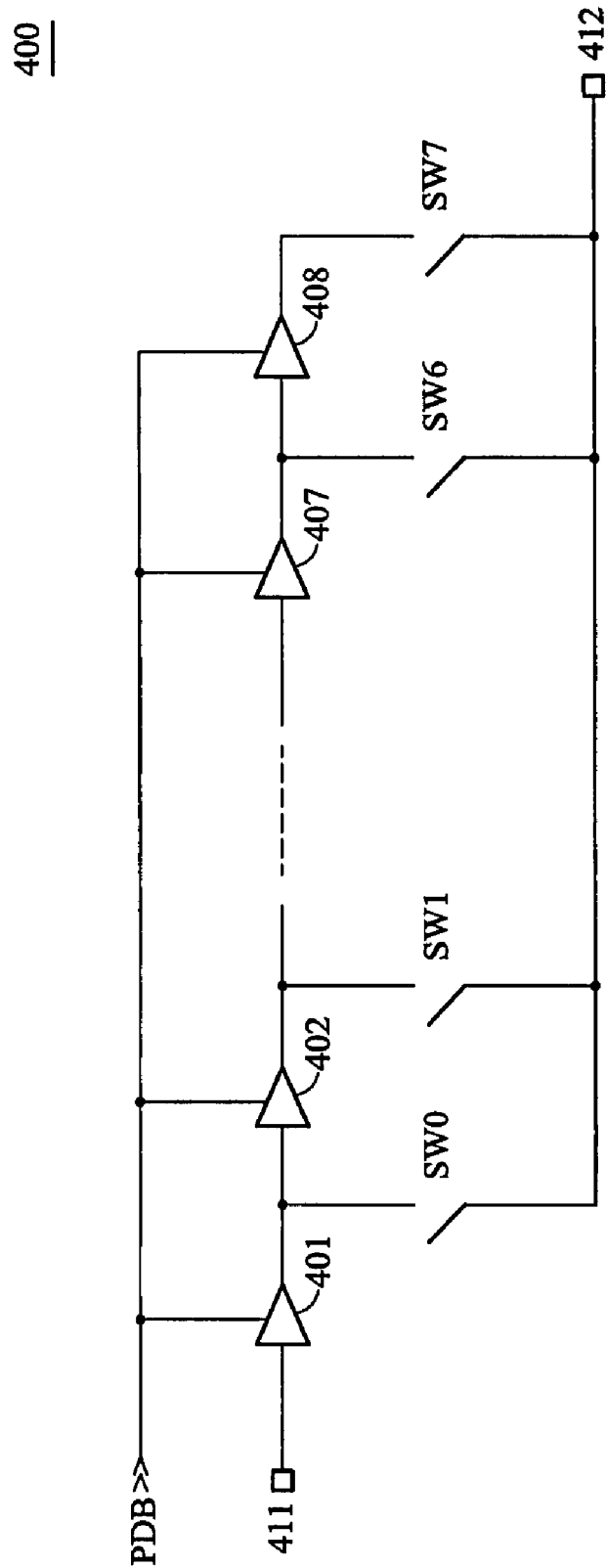
FIG. 4 is a schematic diagram of a delay array according to another embodiment of the invention.

FIG. 4 is a schematic diagram of delay array 400 according to another embodiment of the invention. Delay array 400 can be second delay array 220, third delay array 230 or fourth delay array 240 as shown in FIG. 2. Delay array 400 comprises receiving terminal 411, output terminal 412, eight delay devices 401~408 and eight switches SW0~SW7. As shown in FIG. 4, assuming delay array 400 as second delay array 220 as an example, delay array 400 receives power control signal PDB and delay control signal SEL and receives first delay array clock signal CLKa1 from input terminal 411. Delay devices 401~408 are turned on or off according to power control signal PDB. When delay devices 401~408 of delay array 400 are turned on, each of delay devices 401~408 delays first delay array clock signal by the same delay time. One of switches SW0~SW7 of delay array 400 is turned on according to delay control signal SEL to control the delay time of first delay array clock signal to output to output terminal 412.

Referring to FIG. 2, delay line 200 of delay lock loop 100 of the invention decides the delay time to delay the clock signal according to control signal CNT. Decoder 250 of delay line 200 generates power control signal PDB to turn off delay arrays which are not utilized according to control signal CNT, to reduce unnecessary power consumption for delay lock loop 100.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay line, comprising
   a decoder receiving a control signal to generate a delay control signal, a power control signal and a selecting control signal;
   a first delay array receiving a clock signal and the delay control signal and delaying the clock signal according to the delay control signal to output a first delay array clock signal;
   a second delay array receiving the power control signal, the first delay array clock signal and the delay control signal and turning on or off the second delay array according to the power control signal, wherein when the second delay array is turned on, the second delay array delays the first delay array clock signal according to the delay control signal to output a second delay array clock signal; and a multiplexer receiving the selecting control signal, the first delay array clock signal and the second delay array clock signal and selecting the first delay array clock signal or the second delay array clock signal according to the selecting control signal to output a first delay signal.

2. The delay line as claimed in claim 1, wherein the first delay array comprises a plurality of delay devices coupled in serial, and the delay devices of the first delay array delays the clock signal according to the delay control signal to output the first delay array clock signal.

3. The delay line as claimed in claim 1, wherein the first delay array comprises a first delay device and a second delay device, the first delay device delays the clock signal by a delay time to output a first delay clock signal and transmits the first delay clock signal to the second delay device, and the second delay device delays the first delay clock signal by the delay time to output a second delay clock signal.

4. The delay line as claimed in claim 3, wherein the first delay array outputs the first delay clock signal or the second delay clock signal to the multiplexer and the second delay array according to the delay control signal.

5. The delay line as claimed in claim 4, further comprising a first switch and a second switch, the first switch or the second switch is turned on to respectively output the first delay clock signal or the second delay clock signal according to the delay control signal.

6. The delay line as claimed in claim 1, wherein the second delay array comprises a plurality of delay devices coupled in serial, and when the second delay array is turned on, the delay devices of the second delay array delay the first delay array clock signal to output the second delay array clock signal according to the delay control signal.

7. The delay line as claimed in claim 1, wherein the second delay array comprises a third delay device and a fourth delay device, when the second delay array is turned on, the third delay device delays the first delay array clock signal by a delay time to output a third delay clock signal and transmits the third delay clock signal to the fourth delay device, and the fourth delay device delays the third delay clock signal the delay time to output a fourth delay clock signal.

8. The delay line as claimed in claim 7, wherein when the second delay array is turned on, the second delay array outputs the third delay clock signal or the fourth delay clock signal to the multiplexer according to the delay control signal.

9. A delay lock loop, comprising
a first delay line delaying a clock signal to generate a first delay signal according to a control signal;
a second delay line delaying the first delay signal to generate a second delay signal according to the control signal;
an inverter inverting the clock signal by 180 degrees to generate an inverting signal;
a phase detector comparing the second delay signal and the inverting signal to generate a phase control signal;
a counting controller receiving the phase control signal to generate the control signal for the second delay signal and the inverting signal to be in phase; and
a divider dividing the clock signal to generate a reference clock signal for the counting controller;
wherein the first delay line comprises:

a decoder receiving the control signal to generate a delay control signal, a power control signal and a selecting control signal;
a first delay array receiving the clock signal and the delay control signal and delaying the clock signal to output a first delay array clock signal according to the delay control signal;
a second delay array receiving the power control signal, the first delay array clock signal and the delay control signal and turning on or off the second delay array according to the power control signal, wherein when the second delay array is turned on, the second delay array delays the first delay array clock signal to output a second delay array clock signal according to the delay control signal; and
a multiplexer receiving the selecting control signal, the first delay array clock signal and the second delay array clock signal and selecting the first delay array clock signal or the second delay array clock signal to output the first delay signal according to the selecting control signal.

10. The delay lock loop as claimed in claim 9, further comprising:
a front multiplexer receiving a first clock signal or a second clock signal to output the clock signal according to a selecting inputting control signal.

11. The delay lock loop as claimed in claim 9, wherein the first delay array comprises a first delay device and a second delay device, the first delay device delays the clock signal by a delay time to output a first delay clock signal and transmits the first delay clock signal to the second delay device, and the second delay device delays the first delay clock signal by the delay time to output a second delay clock signal.

12. The delay lock loop as claimed in claim 11, wherein the first delay array outputs the first delay clock signal or the second delay clock signal to the multiplexer and the second delay array according to the delay control signal.

13. The delay lock loop as claimed in claim 12, further comprising a first switch and a second switch, the first switch or the second switch is turned on to respectively output the first delay clock signal or the second delay clock signal according to the delay control signal.

14. The delay lock loop as claimed in claim 9, wherein the second delay array comprises a plurality of delay devices coupled in serial, and when the second delay array is turned on, the delay devices of the second delay array delay the first delay array clock signal to output the second delay array clock signal according to the delay control signal.

15. The delay lock loop as claimed in claim 9, wherein the second delay array comprises a third delay device and a fourth delay device, when the second delay array is turned on, the third delay device delays the first delay array clock signal by a delay time to output a third delay clock signal and transmits the third delay clock signal to the fourth delay device, and the fourth delay device delays the third delay clock signal the delay time to output a fourth delay clock signal.

16. The delay lock loop as claimed in claim 15, wherein when the second delay array is turned on, the second delay array outputs the third delay clock signal or the fourth delay clock signal to the multiplexer according to the delay control signal.

* * * * *